United States Patent [19]
Lin

[11] Patent Number: 5,903,480
[45] Date of Patent: May 11, 1999

[54] DIVISION-FREE PHASE-SHIFT FOR DIGITAL-AUDIO SPECIAL EFFECTS

[75] Inventor: Tao Lin, Fremont, Calif.

[73] Assignee: NeoMagic, Santa Clara, Calif.

[21] Appl. No.: 08/939,603

[22] Filed: Sep. 29, 1997

[51] Int. Cl.[6] .................................................. G06F 17/10
[52] U.S. Cl. .................................................. 364/724.011
[58] Field of Search .................... 364/724.011, 724.1, 364/724.16, 724.19, 724.2

[56] References Cited

U.S. PATENT DOCUMENTS

| | | | |
|---|---|---|---|
| 4,604,720 | 8/1986 | Stikvoort | 364/724.1 |
| 4,797,845 | 1/1989 | Stikvoort | 364/724.1 |
| 5,075,880 | 12/1991 | Moses et al. | 364/724.1 |
| 5,140,543 | 8/1992 | Tanaka | 364/736 |
| 5,170,369 | 12/1992 | Rossum | 364/724.17 |
| 5,204,827 | 4/1993 | Fujita et al. | 364/724.1 |
| 5,226,000 | 7/1993 | Moses et al. | 364/724.1 |
| 5,369,606 | 11/1994 | Hessel | 364/724 |
| 5,432,724 | 7/1995 | Repko | 364/724.16 |
| 5,502,747 | 3/1996 | Mc Grath | 375/350 |
| 5,508,940 | 4/1996 | Rossmere et al. | 364/514 |
| 5,522,010 | 5/1996 | Toyama | 395/2.16 |
| 5,524,120 | 6/1996 | Pride, III et al. | 375/225 |
| 5,530,762 | 6/1996 | Jones, Jr. et al. | 381/63 |
| 5,548,543 | 8/1996 | Wang | 364/724.16 |
| 5,550,869 | 8/1996 | Gurantz et al. | 375/340 |
| 5,566,101 | 10/1996 | Kodra | 364/724.16 |
| 5,604,810 | 2/1997 | Yanagawa | 381/63 |
| 5,619,579 | 4/1997 | Ando et al. | 381/63 |
| 5,787,023 | 7/1998 | Kosugi | 364/724.19 |

OTHER PUBLICATIONS

Cronin, Dennis, "Examining Audio DSP Algorithms", Dr. Dobb's Journal on CD–ROM, vol. 19, Issue 7 (Jul. 1994).

*Primary Examiner*—Tan V. Mai
*Attorney, Agent, or Firm*—Stuart T. Auvinen

[57] ABSTRACT

An audio special-effect is created by a slow phase shift. A series of all-pass digital filters are used to shift the phase of an input stream of digital-audio samples. The amount of phase shift is determined by filter coefficients. The filter coefficients are increased and decreased to sweep the phase shift up and down over a relatively long period of time such as one second per sweep. The filter coefficients must be continuously re-generated by a processor as each sweep occurs. Coefficient generation loads the processor, reducing performance of other programs and user applications. An exact prior-art method requires a division operation for each coefficient generated. Since division operations are slow, the processor is especially burdened by coefficient generation. An approximate method for coefficient generation eliminates the division operation and instead uses a multiply or a simpler shift operation. The newly-generated filter coefficients are sent from the processor to the all-pass digital filters in a digital-signal processor (DSP) to update the filter coefficients, generating the phase shift special effect.

20 Claims, 7 Drawing Sheets

$C(n+1) = C(n) +/- r*[1-C(n)*C(n)]$

| n | 0 | 4410 | 8820 | 13230 | 17640 | 22050 |
|---|---|---|---|---|---|---|
| P(n) | 0.005 | 0.012559 | 0.031548 | 0.079245 | 0.199053 | 0.50 |
| Exact C(n) =(1-(P(n))/(1+P(n)) | 0.99005 | 0.975193 | 0.938834 | 0.853148 | 0.667982 | 0.333334 |
| Notch Frequency 1 | 0.237327 | 0.596133 | 1.497345 | 3.760024 | 9.42682 | 23.40181 |
| Notch Frequency 2 | 1.383175 | 3.473483 | 8.710847 | 21.66116 | 51.3339 | 100.7214 |
| Approx. C(n) =C(n-1)+r*(1-C(n-1)*C(n-l)) | 0.99005 | 0.975195 | 0.938845 | 0.853185 | 0.668079 | 0333511 |
| Notch Frequency 1 | 0.237327 | 0.596076 | 1.497066 | 3.758996 | 9.423556 | 23.39277 |
| Notch Frequency 2 | 1.383175 | 3.473154 | 8.709226 | 21.65537 | 51.31834 | 100.699 |
| Relative Error of Notch Frequency 1 | 0.0000% | 0.0095% | 0.0187% | 0.0273% | 0.0346% | 0.0386% |
| Relative Error of Notch Frequency 2 | 0.0000% | 0.0095% | 0.0186% | 0.0267% | 0.0303% | 0.0222% |

FIG. 7

DIVISION-FREE PHASE-SHIFT FOR DIGITAL-AUDIO SPECIAL EFFECTS

BACKGROUND OF THE INVENTION—FIELD OF THE INVENTION

This invention relates to digital-audio systems, and more particularly to phase-shifting without using division for audio special effects.

BACKGROUND OF THE INVENTION—DESCRIPTION OF THE RELATED ART

Personal computers (PC's) are using more sophisticated audio systems. Better audio systems improve the user's experience when using programs, games, or interactive training applications, and when viewing multi-media presentations.

Often these applications employ audio special effects. A common special effect is known as phase shifting, where the phase of an audio stream is varied over a relatively long period of time. Phase-shifting can produce a variety of sounds. A striking swooshing sound can be produced by phase shifting. Music from the 1970's often employed phase-shift special effects. Examples of such effects are found on the album "Dark Side of the Moon" by the musical group Pink Floyd.

Digital-audio systems are becoming more commonplace in personal computers. A digital-signal processor (DSP) or the main microprocessor or central processing unit (CPU) of a PC can be used to modify digital audio signals. Finite or infinite-impulse-response (FIR, IIR) filters either in a DSP, or implemented in software running on the PC's CPU can be used to implement special audio effects such as phase shifting. In a digital filter, digitized audio signals are modified by multiplication with filter coefficients. These filter coefficients can be varied over time to produce the desired special effect. However, new sets of filter coefficients must be repeatedly generated and applied to the filter over the relatively long cycle of the special effect. Generation of the new sets of filter coefficients can absorb much of the CPU's bandwidth, reducing performance of other applications running on the PC.

A phase shift special effect is created by varying the filter coefficients applied a digital filter. Digital audio input signals are filtered by a series of infinite input response (IIR) filters each with the transfer function:

$$\frac{C(n) - z^{-1}}{1 - C(n) * z^{-1}}$$

expressed here in the frequency domain. The variable z is a delay factor. Each IIR filter can vary the phase by up to 90 degrees, so four IIR filters are required for phase shifts up to 360 degrees. The unshifted input is also added to the phase-shifted output so that the overall filter has the following frequency-domain transfer function:

$$H(z) = 1 + \frac{C(n) - z^{-1}}{1 - C(n) * z^{-1}} * \frac{C(n) - z^{-1}}{1 - C(n) * z^{-1}} * \frac{C(n) - z^{-1}}{1 - C(n) * z^{-1}} * \frac{C(n) - z^{-1}}{1 - C(n) * z^{-1}}$$

Each of the four terms with filter coefficients $C(n)$ is an all-pass filter that only shifts the phase. Each filter can shift the phase by up to 90 degrees. The overall filter $H(z)$ is essentially a notch filter with two notch frequencies. The set of filter coefficients $C(n)$ is repeatedly re-generated from:

$$C(n) = \frac{1 - P(n)}{1 + P(n)}$$

where $P(n)$ are the sweep coefficients. For the special effect, $P(n)$ is swept up and then down to vary the phase shift over a cycle. The $P(n)$ coefficients are generated starting from a minimum sweep-coefficient value called $P_{MIN}$. Each previously-generated $P(n)$ coefficient is multiplied by an up-sweep constant p that is greater than 1:

$$P(0)=P_{MIN},\ P(1)=P(0)*p,\ P(2)=P(1)*p,\ P(3)=P(2)*p,\ \ldots\ P(n)=P(n-1)*p,$$

until $P(n)$ reaches the maximum value $P_{MAX}$. Then $P(n)$ is swept down by a down-sweep constant q that is the reciprocal of constant p and thus less than one:

$$P(n)=P(n-1)*q,\ \ldots$$

until the minimum sweep-coefficient value $P_{MIN}$ is reached. Then the sweep cycle of the special effect repeats itself. Different phase shifts and different effects are produced by using different values for p, $P_{MIN}$ and $P_{MAX}$.

Thus $P(n)$ is swept up and down, and then the filter coefficients $C(n)$ are calculated from the values of $P(n)$. The new filter coefficients $C(n)$ are continuously updated and applied to the filters, producing the special audio effect.

Coefficient Generation Slows CPU Performance

While the filtering and phase shifting of the digital-audio samples is usually performed in a dedicated DESP, the filter coefficients $C(n)$ must be generated by the PC's general-purpose CPU. For most types of digital filters, the coefficients are not continuously varied and thus can be generated once and stored for use by the DSP. Thus the CPU only has to generate the filter coefficients once, limiting the performance degradation.

Special audio effects continuously vary the filter coefficients and thus require that the CPU constantly re-generate the filter coefficients. This can severely load the CPU, reducing the performance of other applications that must also execute on the CPU. Thus reducing the computational burden on the CPU for filter-coefficient generation is desirable.

Coefficient Generation Uses Division—FIG. 1

FIG. 1 is a diagram of a prior-art coefficient generator for a phase shifter. This coefficient generation is usually performed by software executing on the PC's general-purpose microprocessor or CPU.

A previous value of the sweep coefficient $P(n-1)$ is stored in register 15. Multiplier 12 receives the value of $P(n-1)$ from register 15 and multiplies it by either constant p or constant q to generate the next value of the sweep coefficient $P(n)$. The up-sweep constant p is applied to multiplier 12 during up-sweeping, while the reciprocal of p, the down-sweep constant q, is applied during down-sweeping. The value of $P(n)$ is compared to $P_{MAX}$ and $P_{MIN}$ to determine when to switch constants p and q.

Adder 14 then increments $P(n)$ while subtractor 18 generates $1-P(n)$. The value of $1-P(n)$ from subtractor 18 is then divided by $1+P(n)$ from adder 14 in divider 20. Divider 20 outputs the quotient as the filter coefficient $C(n)$. Each new filter coefficient $C(n)$ is sent immediately to the filter.

While separate hardware blocks for adder 14, subtractor 18, multiplier 12, and divider 20 are possible, generally these are part of the CPU's arithmetic-logic-it (ALU) or floating point unit (FPU). Usually multiplier 12 is a hardware multiplier, while divider 20 repeatedly uses the shifter and adder in the ALU in multiple clock cycles to perform division.

While such as phase-shifter is effective, it requires a relatively large amount of processing power and resources. This reduces the processing power available to other applications running on the personal computer, and thus slows the system down. In particular, the division step requires a lengthy division operation by the PC's microprocessor. Division is a lengthy, multi-cycle process on microprocessors, even when a dedicated floating-point processor is available.

What is desired is a phase-shift method for digital-audio special effects. It is desired to eliminate division by the CPU for generation of filter coefficients. It is desired to eliminate division to improve performance and reduce the burden on the CPU in a PC. A simplified coefficient-generator for a phase-shifter is desired that does not use division.

SUMMARY OF THE INVENTION

A filter-coefficient generator generates filter coefficients for a digital-audio filter to create an audio special effect. The filter-coefficient generator has a storage that stores a maximum filter coefficient and a minimum filter coefficient. The storage also stores a sweep factor. A last storage stores a last filter-coefficient generated by the filter-coefficient generator.

A first multiplier is coupled to the last storage. It multiplies the last filter-coefficient by last filter-coefficient to generate a square of the last filter-coefficient. A first subtractor is coupled to receive the square of the last filter-coefficient from the first multiplier. It subtracts the square of the last filter-coefficient from one and outputs a first output.

A second multiplier receives the first output from the first subtractor. It multiplies the first output with the sweep factor from the storage. The second multiplier outputs a second output.

A final adder receives the second output and receives the last filter-coefficient. It adds the second output to the last filter-coefficient during an up-sweep, but it subtracts the second output from the last filter-coefficient during a down-sweep. The final adder outputs a next filter-coefficient to the last storage for storage as the last filter-coefficient for a next cycle.

A coefficients output receives the next filter-coefficient from the final adder. It outputs the next filter-coefficient to the digital-audio filter. The next filter-coefficient replaces an existing filter coefficient in the digital-audio filter. The digital-audio filter produces a different phase shift when the next filter-coefficient replaces the existing filter coefficient. Thus filter coefficients producing a different phase shift are generated.

In further aspects the next filter-coefficient is generated without a division operation. The storage also stores a maximum filter coefficient and a minimum filter coefficient.

A direction-reverser receives the last filter coefficient. It compares the last filter coefficient to the maximum filter coefficient and to the minimum filter coefficient. The direction-reverser generates a sweep reversal signal when the last filter coefficient matches either the maximum filter coefficient or the minimum filter coefficient. Thus the sweep reversal signal indicates when the up-sweep changes to the down-sweep and when the down-sweep changes to an up-sweep. The final adder is responsive to the sweep reversal signal from the direction-reverser. The final adder adds during an up-sweep, but subtracts during a down-sweep. Thus the sweep direction is reversed.

In still further aspects of the invention the filter coefficients are continuously regenerated while the digital-audio filter creates the audio special effect. The sweep factor is a plurality of electrical signals that represent an exact binary power of two. The second multiplier is a shifter for shifting the first output by a number of bit-positions determined by the sweep factor from the storage. The shifter outputs the second output. Thus one multiply and one shift are used to generate each filter coefficient.

In other aspects the first multiplier and the second multiplier are a program that controls a multiplier on a general-purpose processor. The first subtractor and the final adder are a program that controls an adder in the general-purpose processor. Thus the filter-coefficient generator includes a program executing on the general-purpose processor using the multiplier and the adder.

BRIEF DESCRIPTION OF THE DRAWINGS

FIG. 7 is a table comparing a typical audio special effect using the prior-art exact method and the inventor's approximate method.

DETAILED DESCRIPTION

Figure 1:
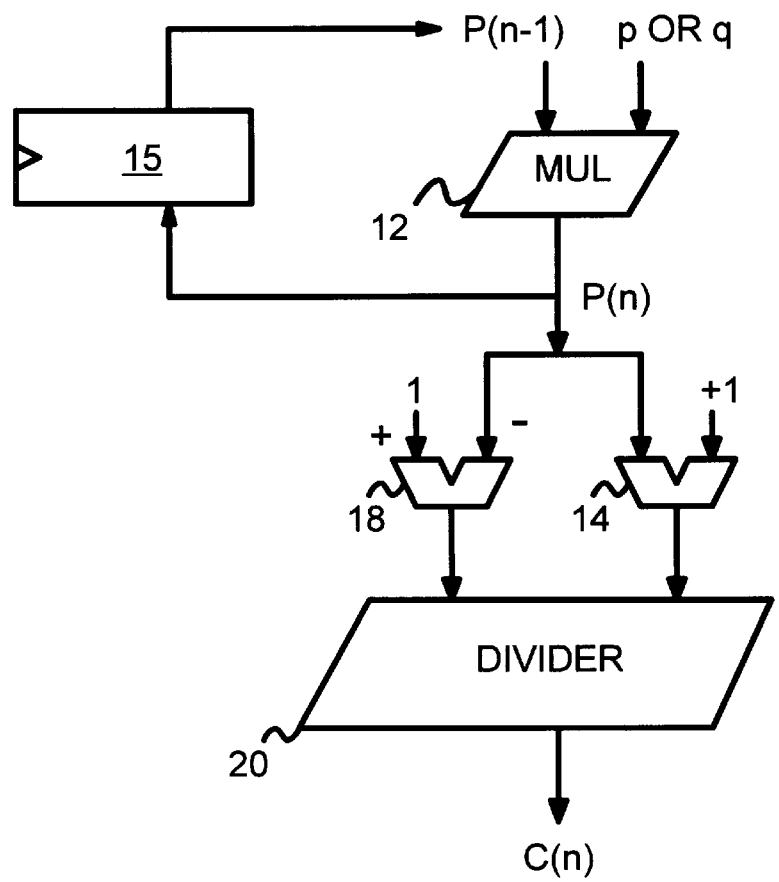
FIG. 1 is a diagram of a prior-art coefficient generator for a phase shifter.

The present invention relates to an improvement in digital-audio filtering. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that sound effects are not as critical as other kinds of audio samples. While high fidelity and precision are important for voice clips and music synthesis and reproduction, such precision is not necessary for sound effects such as phase shifting. The phase can be shifted at a slightly different rate without discernment by many listeners. Since all-pass filters are used, none of the original audio input is lost; it is merely phase shifted. The exact degree of the phase shift is less significant than the reproduction of the original audio input itself.

The inventor has determined that an approximation to the generation of the filter coefficients produces nearly the same sound effect, but with much less computational work by the central processor in a personal computer (PC). In particular, the multi-step division in the prior-art coefficient generation can be eliminated, greatly reducing the computational burden on the PC's central processing unit (CPU).

The inventor has realized that the endpoints of the phase shift are critical, while the exact steps swept within the range are less critical. The prior art used an exponential increase and decrease in the sweep, but this used a division operation. The inventor instead directly generates the filter coefficients rather than the sweep coefficients.

The sweep coefficients P(n) are not calculated during the sweep at all. The sweep coefficients are only needed for determining the endpoint constants. The endpoint constants are determined just once during setup and then stored and used as constants for all sweeps. Thus the endpoint calculation is not repeated for each sweep cycle, greatly reducing computational burden.

Instead of recursively generating both the sweep coefficients P(n) and the filter coefficients C(n) during each sweep, only the filter coefficients C(n) are generated during each sweep. The inventor's approximation avoids re-generation of the sweep coefficients P(n) during each sweep cycle.

Endpoints Generated Once During Setup

The endpoints of the sweeps are calculated to be the same endpoints as the exact prior-art method. When desired values for $P_{MAX}$, $P_{MIN}$, and sweep rate p are known for a desired special effect, endpoints for the filter coefficient are calculated as:

$$C_{MIN} = \frac{1 - P_{MAX}}{1 + P_{MAX}} \quad C_{MAX} = \frac{1 - P_{MIN}}{1 + P_{MIN}}$$

These are the filter-coefficient endpoints that correspond to $P_{MAX}$ and $P_{MIN}$. Instead of using the sweep constants p and q on values of P(n), an update factor r is determined for sweeping the filter coefficients C(n). This update factor r is:

$$r = \frac{1 - p}{1 + p}$$

The endpoint values $C_{MAX}$, $C_{MIN}$, and r are determined during a setup procedure before the special effect begins. Thus the endpoints values are determined just once at the beginning, not for each sweep of the special effect. Thus the computational work for determining the endpoints is negligible.

These endpoint values $C_{MAX}$, $C_{MIN}$, and r can be stored in program memory rather than calculated. Thus a presentation program might simply store the endpoint values of $C_{MAX}$, $C_{MIN}$, and r and use these stored values for generating the special audio effect. A programmer could experiment with different values of $C_{MAX}$, $C_{MIN}$, and r to determine the desired values that best generate the desired special effect.

Recursive Generation of C(n) Without P(n)

During each sweep of the phase shift, a new set of the filter coefficients C(n) are generated. The down-sweep begins with $C_{MIN}$, and sweeps to $C_{MAX}$, while the up-sweep begins with $C_{MAX}$, and sweeps to $C_{MIN}$.

During the down-sweep, C(n) is recursively calculated as:

$C(0) = C_{MIN}$, $C(1) = C(0) - r*[1 - C(0)*C(0)]$, . . .

$C(n+1) = C(n) - r*[1 - C(n)*C(n)]$, until C(n+1) reaches $C_{MAX}$. Then during the up-sweep C(n) is recursively calculated as:

$C(n+1) = C(n) + r*[1 - C(n)*C(n)]$, where the term $r*[1-C(n)*C(n)]$ is added rather than subtracted until $C_{MIN}$ is reached. Then the sweep cycle repeats with the up-sweep. The term $r*[1-C(n)*C(n)]$ is usually a negative number.

The recursive generation of C(n) uses multiplication rather than division, greatly reducing the amount of computation work required of the PC. The special effect produced has the same endpoints as with the prior-art method, and has about the same effect, but requires only two multiplies and two addition/subtractions.

Figure 2:
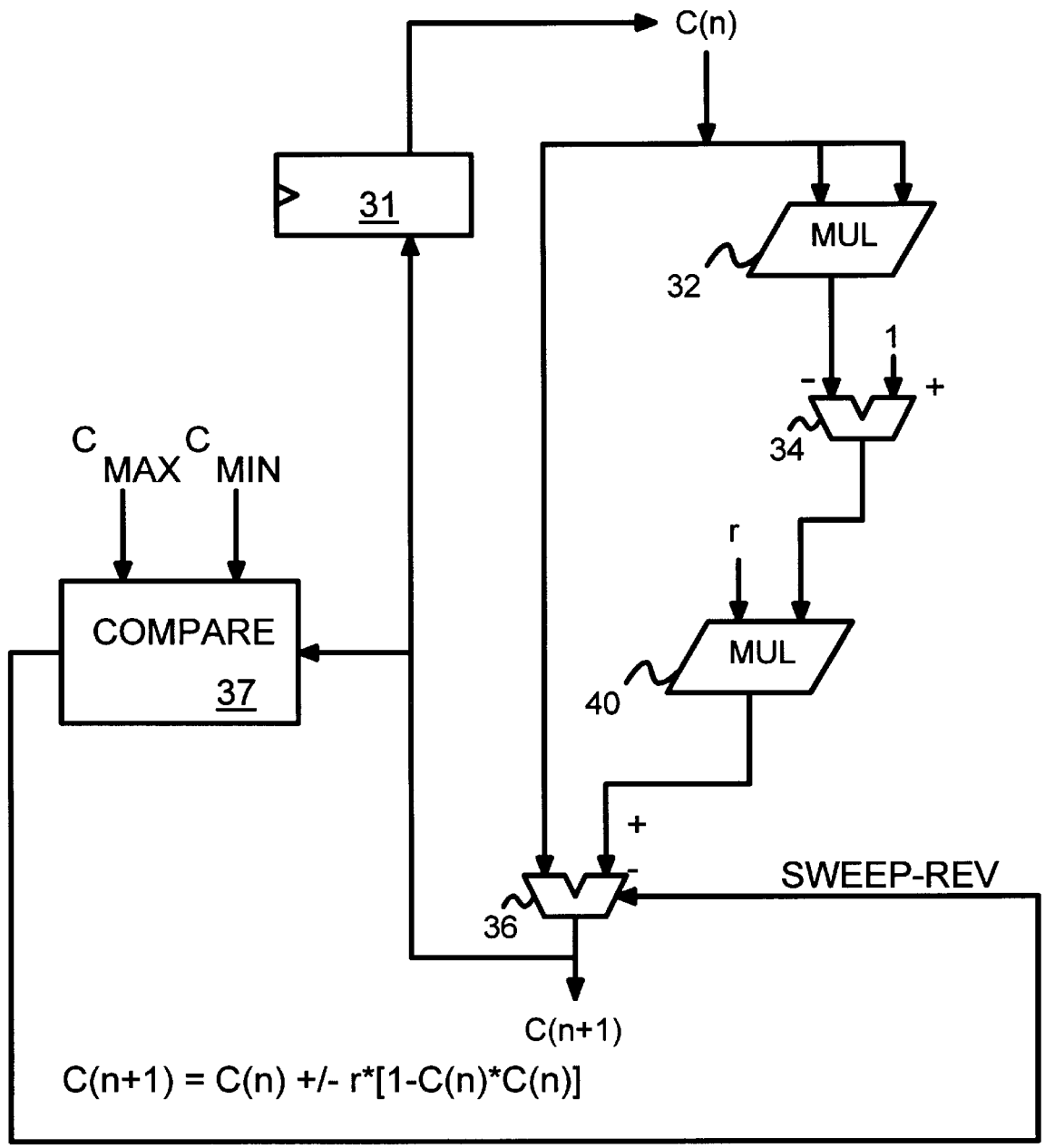
FIG. 2 is a diagram of filter-coefficient generation using two multiplies and no division.

Coefficient Generation Using Multiply—FIG. 2

FIG. 2 is a diagram of filter-coefficient generation using two multiplies and no division. Register 31 stores the last filter coefficient generated, C(n+1), which becomes C(n). The last filter coefficient C(n) is applied to both inputs of multiplier 32, so that multiplier 32 outputs the square of C(n), or C(n)*C(n). Subtractor 34 then subtracts the square of C(n) from multiplier 32 from one, and outputs 1−C(n)*C(n) to multiplier 40. Multiplier 40 also receives the sweep factor r, which is a constant for both up and down sweeps.

The output from multiplier 40 is the term $r*[1-C)n)*C(n)]$ which is added during down-sweeps but subtracted during up-sweeps. Adder 36 receives the last filter coefficient C(n) from register 31 and either adds or subtracts from it the term from multiplier 40. The output from adder 36 is the next filter coefficient C(n+1) which is loaded into register 31 and sent to the digital-signal processor (DSP) to update the filter coefficients.

While separate hardware blocks for subtractor 34, adder 36, and multipliers 32, 40 are possible, generally these are part of the CPU's arithmetic-logic-unit (ALU) or floating point unit (FPU). Usually multipliers 32, 40 are the same hardware multiplier, used at different times. Likewise one adder/subtractor in the ALU is used twice for subtractor 34 and adder 36.

The filter coefficient is compared to either the minimum filter coefficient $C_{MIN}$, or the maximum filter coefficient $C_{MAX}$, by comparator 37. When either $C_{MIN}$ or $C_{MAX}$ is reached, the direction of the sweep is reversed. The sweep-reversal signal SWEEP-REV is sent to adder 36 to cause it to change the sign of the term from multiplier 40 so subtracting is performed instead of adding, or adding instead of subtracting.

Figure 3:
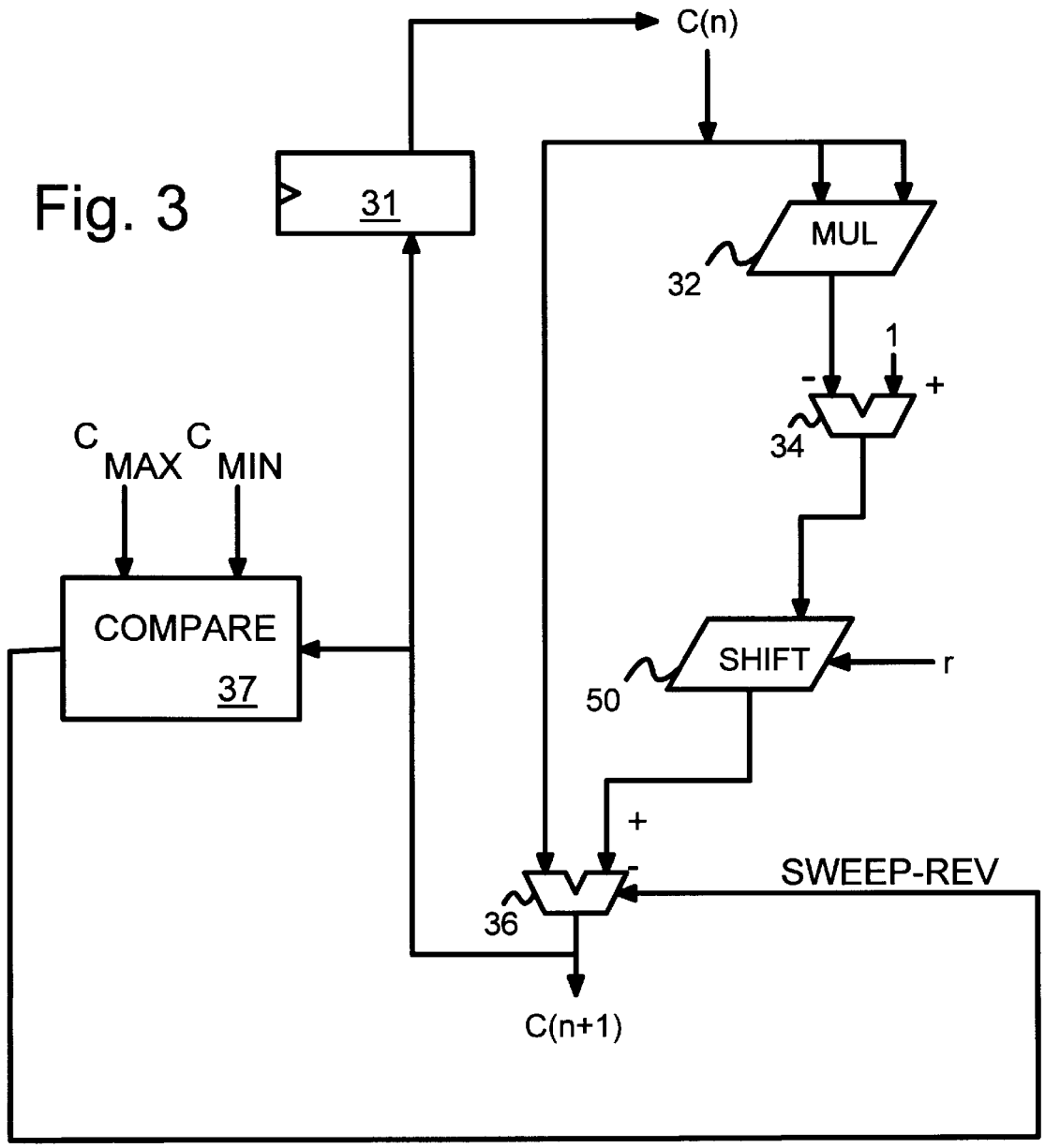
FIG. 3 is a diagram of filter-coefficient generation using a shifter and a multiplier and no division.

Coefficient Generation Using Shifter—FIG. 3

FIG. 3 is a diagram of filter-coefficient generation using a shifter and a multiplier and no division. Multiplier 40 of FIG. 2 can be replaced with shifter 50 of FIG. 3 when the sweep factor r is restricted to a power of 2 and binary components are used. Shifter 50 shifts the output from subtractor 34 to the left by one bit-position for every power of two of sweep-factor constant r. Thus when r is 8, shifter 50 shifts to the left by 3 bit-positions. Fractional values of r can be supported by right-shifting in shifter 50.

Register 31 stores the last filter coefficient generated, C(n+1), which becomes C(n). The last filter coefficient C(n) is applied to both inputs of multiplier 32, so that multiplier 32 outputs the square of C(n), or C(n)*C(n). Subtractor 34 then subtracts the square of C(n) from multiplier 32 from one, and outputs 1−C(n)*C(n) to shifter 50. Shifter 50 receives the sweep factor r as the shift-amount input. Sweep factor r is a constant for both up and down sweeps.

The output from shifter 50 is the term r*[1–C)n)*C(n)] which is added during down-sweeps but subtracted during up-sweeps. Adder 36 receives the last filter coefficient C(n) from register 31 and either adds or subtracts from it the term from shifter 50. The output from adder 36 is the next filter coefficient C(n+1) which is loaded into register 31 and sent to the digital-signal processor (DSP) to update the filter coefficients.

The filter coefficient is compared to either the minimum filter coefficient CMIN, or the maximum filter coefficient CMAX, by comparator 37. When either CMIN or CMAX is reached, the direction of the sweep is reversed. The sweep-reversal signal SWEEP-REV is sent to adder 36 to cause it to change the sign of the term from shifter 50 so subtracting is performed instead of adding, or adding instead of subtracting.

Figure 4:
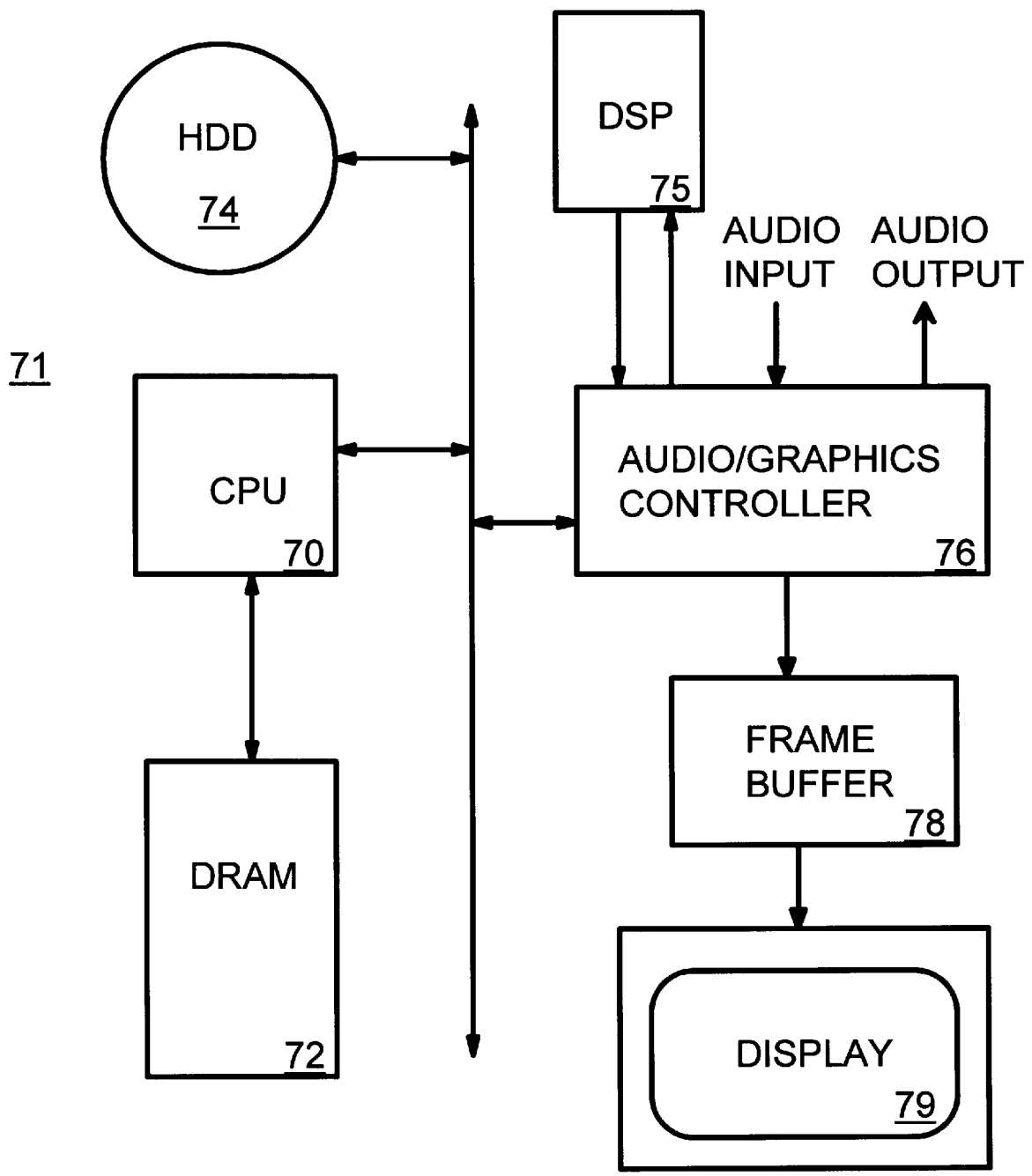
FIG. 4 is a diagram of a personal computer with an audio DSP and a filter coefficients generator.

PC With Coefficients Generator—FIG. 4

FIG. 4 is a diagram of a personal computer with an audio DSP and a filter coefficients generator. PC 71 is a multimedia PC with advanced audio capabilities. A main processor or CPU 70 is a microprocessor such as AMD's K6 or Intel's Pentium™ processor that executes software programs including the Windows operating system. Programs and data are stored in DRAM main memory 72, and backed up to hard disk 74 for permanent storage.

Programs executing on CPU 70 update the information displayed on display 79 by making calls to operating-system functions that write to frame buffer 78. Frame buffer 78 contains a pixel-map of the lines of pixels displayed on display 79. These lines are transferred from frame buffer 78 to display 79 under control of multimedia controller 76.

An external audio source, such as a video feed, microphone, or DVD or CD-ROM audio feed, is applied to an audio input to multimedia controller 76. The audio from the external audio source is digitized by an A/D converter. The digitized audio samples are buffered by a FIFO in multimedia controller 76 and then read by CPU 70 for storage in main memory 72 or on hard disk 74. The digitized audio samples may also be sent directly to DSP 75 for filtering, or read from main memory 72 to DSP 75 for filtering. The filtered audio samples are then converted to analog and output from multimedia controller 76 as the audio output to external speakers.

In one embodiment, software executing on CPU 70 generates the filter coefficients for DSP 75. When DSP 75 is not present, such as for low-end PC's, CPU 70 must perform the tasks of DSP 75 as well as filter-coefficients generation. For special audio effects such as phase shifting, the filter coefficients are continuously re-generated by CPU 70 and sent to DSP 75. The process of FIG. 2 or FIG. 3 is executed by an audio special-effects program executing on CPU 70 to generate the filter coefficients.

As the filter coefficients C(n) are updated in a coefficients storage in DSP 75, the filter's properties change, causing an audible phase shift.

Figure 5:
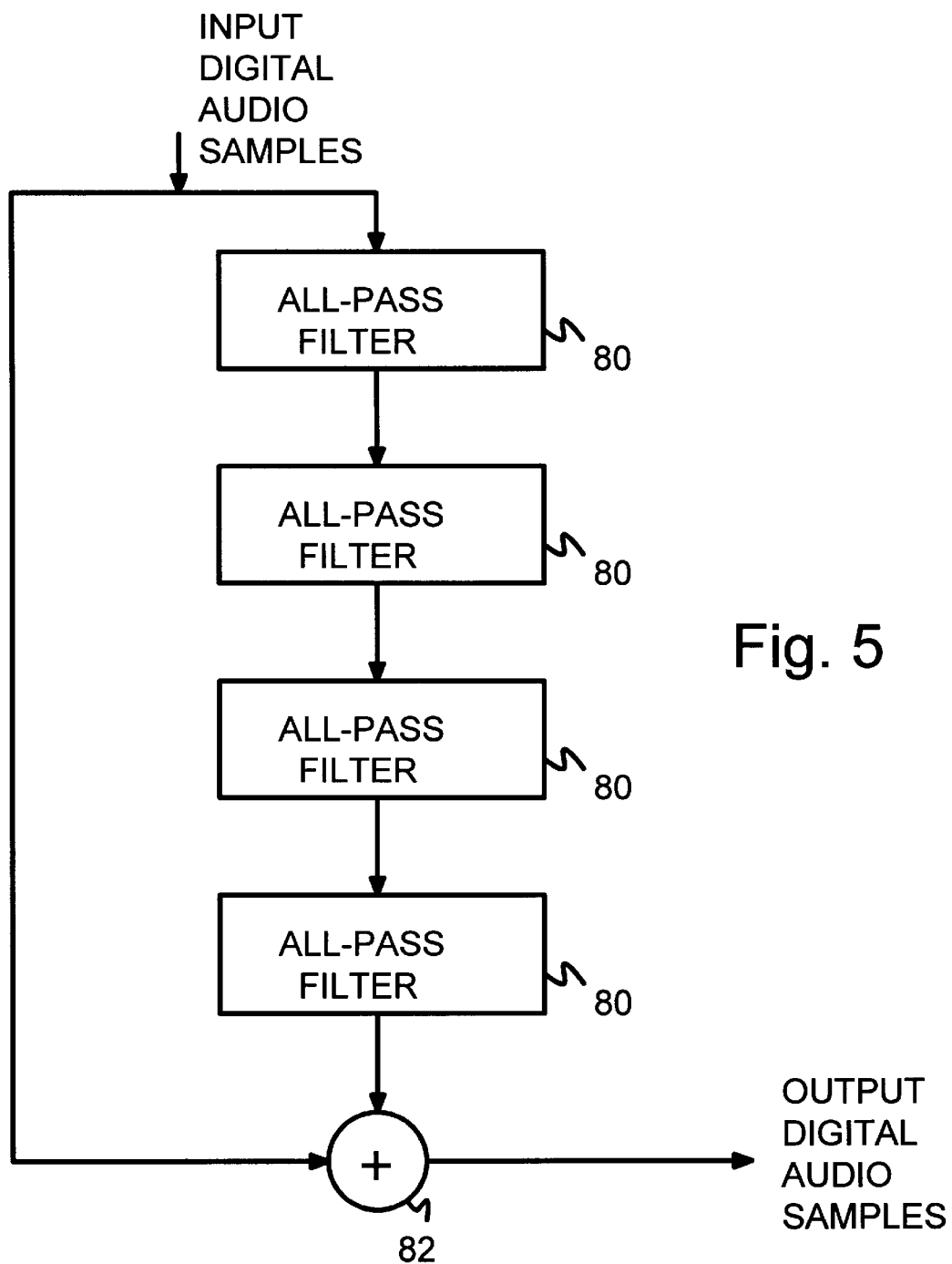
FIG. 5 is a diagram of a notch filter for performing audio special effects such as phase shifting.

DSP Notch Filter—FIG. 5

FIG. 5 is a diagram of a notch filter for performing audio special effects such as phase shifting. DSP 75 of FIG. 4 executes a program that performs the filtering shown in FIG. 5 on an input stream of digital audio samples.

Each sample of the input audio stream x(0), x(1), ... x(m) is a multi-bit binary value that represents the intensity of sound at a point in time. Sample rates of 8 to 48 kHz are common, as are 8-bit and 16-bit audio samples. Since sample rates in the kHz range are much slower than CPU and DSP clock rates in the MHz range, many operations can be performed on each sample.

The input audio samples are each sent to the first of four all-pass filters 80. Each all-pass filter 80 can shift the phase by up to 90 degrees, so the four filters 80 can together shift phase up to 360 degrees. Each all-pass filter 80 performs the function:

$$\frac{C(n) - z^{-1}}{1 - C(n) * z^{-1}}$$

where C(n) are the filter coefficients. These filter coefficients are generated over time as different samples are processed. For example, a first coefficient C(0) is applied to the first audio input sample, then the second filter coefficient C(1) is applied to the second audio sample, and then the third coefficient C(2) is applied to the filtering of the third audio sample, and so on. The generation of C(n) can be synchronized to the audio sample rate, or it can be less than the audio rate so that each filter coefficient is applied to several audio input samples. The input audio sample is filtered by all four all-pass filters 80, and the filtered result is sent to adder 82. Adder 82 adds the original unfiltered input sample to the filtered sample output from the fourth all-pass filter 80. The sum from adder 82 is the output sample. Once the first output sample y(0) is generated from x(0), then the second input sample x(1) is filtered to obtain output sample y(1).

Figure 6:
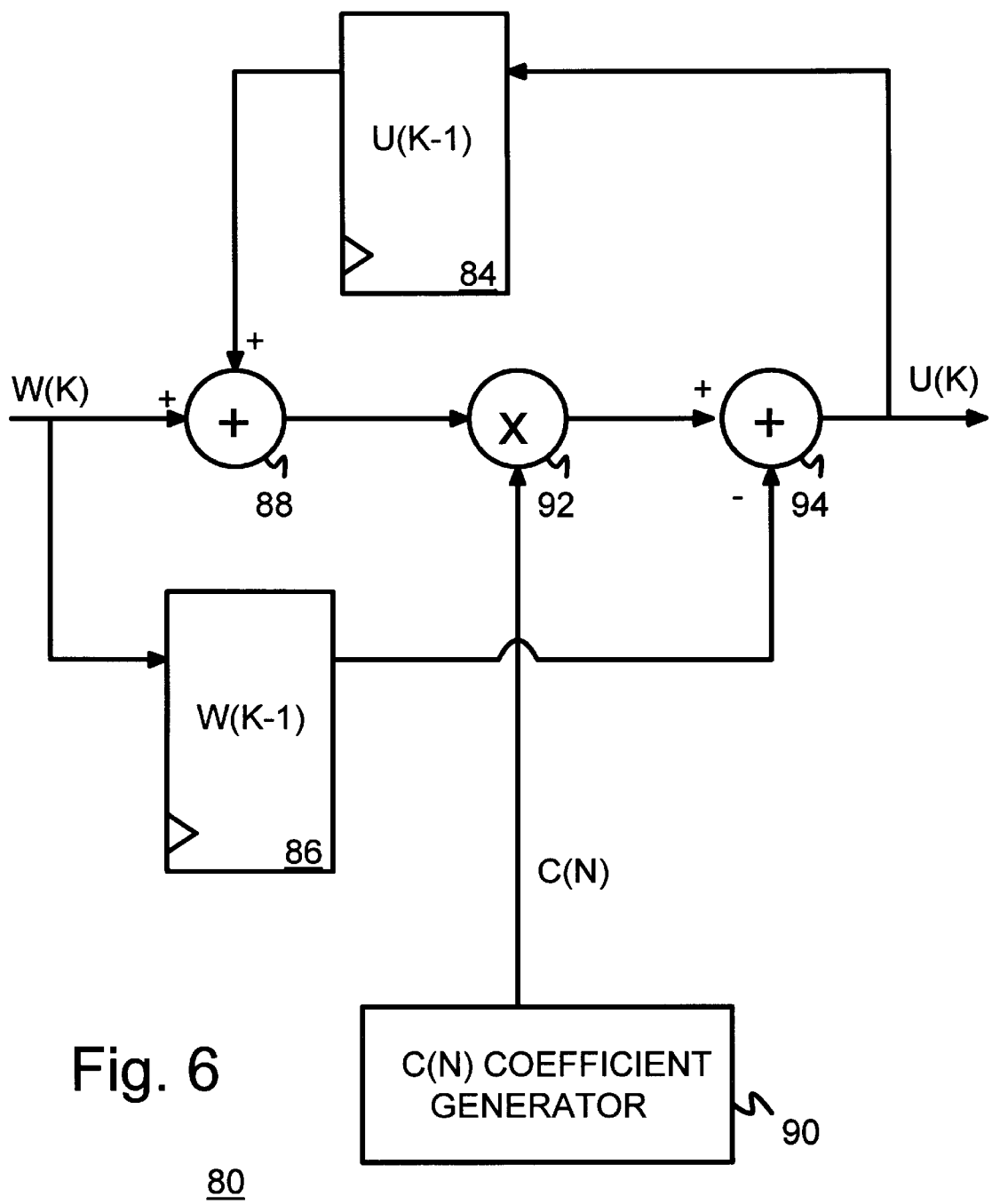
FIG. 6 is a diagram of an all-pass filter that sweeps phase to create audio special effects.

All-Pass Filter for Audio Special Effects—FIG. 6

The transfer function for all-pass filter 80 of FIG. 5 can be described in the time domain rather than in the frequency domain. The equivalent in the time domain of the all-pass filter's function is:

$$u(k)=C(n)*w(k)-w(k-1)+C(n)*u(k-1)$$

where w(k) is the input to any one stage of the four all-pass filters 80 while u(k) is the output of the filter stage. Since k is the time index, w(k−1) is the input for the last sample, and u(k−1) is the output of the last sample. The filter coefficients C(n) are still calculated as described before since the coefficients are the same in both the frequency domain and the time domain. Since the coefficients index n is not the same as the time index k, the coefficients can be updated at a different rate than the rate the input audio samples are processed. However, the filter coefficients C(n) are normally updated at the same rate that the audio samples x(k), w(k) are filtered for control simplicity.

The above time-domain equation can be simplified as:

$$u(k)=C(n)*[w(k)+u(k-1)]-w(k-1).$$

which can be implemented in DSP 75 of FIG. 4 as shown in FIG. 6.

FIG. 6 is a diagram of an all-pass filter that sweeps phase to create audio special effects. The w(k) input is the audio-sample input to all-pass filter 80 of FIG. 5. The u(k) output is the output from all-pass filter 80. The u(k) output of the first filter 80 of FIG. 5 feeds the w(k) input of the second filter 80, while the second filter's u(k) output feeds the w(k) input of the third stage all-pass filter 80, etc. Thus the u(k) outputs and the w(k) inputs of all-pass filters 80 are cascaded together.

The previous w(k) input to all-pass filter 80 is stored in latch 86 until the next audio sample is processed, while the previous u(k) output is stored in latch 84. Thus latch 86 stores the last w(k) input, which becomes the w(k−1) input for the next sample. Likewise latch 84 stores the last u(k) output, which becomes the u(k−1) output for the next sample.

Adder 88 adds the current w(k) input sample to the last output sample, u(k−1), from latch 84. The sum is sent to multiplier 92, which multiplies the sum by the filter coefficient C(n). C(n) is generated by the CPU as described for FIGS. 2 or 3, and sent from coefficient generator 90 on the CPU to the DSP chip. When a set of filter coefficients are cycled through, coefficient generator 90 sends a different coefficient C(n) for each audio sample processed in an up-sweeping or down-sweeping fashion.

Adder 94 receives the product of C(n) and w(k)+u(k−1) from multiplier 92. Adder 94 subtracts the last input, w(k−1), stored in latch 84, from the product from multiplier 92. The difference from adder 94 is the output audio sample for the filter stage, and is sent the next all-pass filter stage.

Example of Audio Special Effect

As an example of typical values for an audio special effect, a typical effect is generated with $P_{MIN}=0.005$ and $P_{MAX}=0.5$. The notch filter has two notch frequencies $\omega_1$ and $\omega_2$. The first notch frequency sweeps between:

$\omega_1 = 2 \cdot atan[P(n) \cdot tan(22.5°)] = 0.237°$ at $P_{MIN}$ and $\omega_1 = 2 \cdot atan[P(n) \cdot tan(22.5°)] = 23.4°$ at $P_{MAX}$ while the second notch frequency sweeps between:

$\omega_2 = 2 \cdot atan[P(n) \cdot tan(67.5°)] = 1.38°$ at $P_{MIN}$ and $\omega_2 = 2 \cdot atan[P(n) \cdot tan(67.5°)] = 100.7°$ at $P_{MAX}$.

For a sweep rate of x up-and-down-sweep cycles per second, and a sample rate of the input stream of 44.1 kHz, the up-sample rate p is:

$p = (P_{MAX}/P_{MIN})^{2 \cdot X/SAMPLE\ RATE} = (0.5/0.005)^{2 \cdot 1/44100} = 1.000208873$ when x=1 sweep per second. This produces a sound effect that sweeps up and down in phase once every second.

When the approximate method of the invention is used, $C_{MAX}$, and $C_{MIN}$ are calculated from $P_{MIN}$ and $P_{MAX}$. The sweep factor r is:

$r = (1-p)/(1+p) = (1-1.000208873)/(1+1.000208873)$ or r=−0.0010442559415646. Since the down-sweep occurs in half a second, and there are 44,100 samples per second, the index n is swept from 0 to 22050 and then back to 0.

FIG. 7 is a table comparing a typical audio special effect using the prior-art exact method and the inventor's approximate method. Values of P(n), C(n), and the two notch frequencies using the prior-art exact method are compared to values of C(n) and the two notch frequencies in the table. The relative errors are also shown. As can be seen, the error in the notch frequencies using the inventor's approximate method is less than 0.04% for the worst case at $P_{MAX}$. The exact method gives a maximum first notch frequency of 23.40181°, while the inventor's method gives a maximum first notch frequency of 23.39277°, a difference of 0.00904°.

ADVANTAGES OF THE INVENTION

The invention produces almost the same audio special effect as the exact prior-art method, buts does so using an approximation that eliminates division. The worst-case error in notch frequencies is only 0.04% in the example above, or one part in 2,500. Thus the same audio special effect is created, but without lengthy division in each of the recursive coefficient-generating steps. The invention preserves the endpoints while slightly varying the rate of phase shifting.

The invention uses less of the processor's computational bandwidth because the computations for filter coefficient generation do not use division, which is complex to implement and slow to execute on PC's. While a prior-art approach requires a division, a multiply and two adds/subtracts, the invention requires only two multiplies and two adds/subtracts. Multiplies are much less compute-intensive than divisions, which require multiple clock cycles in a CPU's ALU. One of the multiplies of the invention can be reduced to an even simpler shift by proper choice of the constant r. Thus the invention not only uses fewer computational operations, but it uses the simpler shift operation and eliminates the complex division operation.

The higher performance of the invention allows for real-time processing of audio input streams, and frees the PC's processor for other tasks. The user is aware of the released processor resources by increased responsiveness of user applications. Since audio input streams are often used with other processor-intensive applications, the reduced processing requirement of the invention is especially noticeable.

ALTERNATE EMBODIMENTS

Several other embodiments are contemplated by the inventors. For example the multimedia controller or DSP may have sufficient programmability to generate its own filter coefficients rather than using the main CPU. Thus the filter-coefficient generator program may execute on the DSP rather than on the CPU. On the other hand, the entire filter of the DSP may be implemented on the CPU.

The invention can be applied to other systems besides personal computers such as consumer audio systems, and may be applied to many variations or kinds of personal computers. Staging registers between the filters 80 can be added for timing reasons.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A filter-coefficient generator for generating filter coefficients for a digital-audio filter to create an audio special effect, the filter-coefficient generator comprising:

storage means for storing a maximum filter coefficient and a minimum filter coefficient, the storage means also storing a sweep factor;

last storage means for storing a last filter-coefficient generated by the filter-coefficient generator;

first multiplier means, coupled to the last storage means, for multiplying the last filter-coefficient by last filter-coefficient to generate a square of the last filter-coefficient;

first subtractor means, coupled to receive the square of the last filter-coefficient from the first multiplier means, for subtracting the square of the last filter-coefficient from one and outputting a first output;

second multiplier means, receiving the first output from the first subtractor means, for multiplying the first output with the sweep factor from the storage means, the second multiplier means outputting a second output;

final adder means, receiving the second output and receiving the last filter-coefficient, for adding the second output to the last filter-coefficient during an up-sweep, but for subtracting the second output from the last filter-coefficient during a down-sweep, the final adder means outputting a next filter-coefficient to the last storage means for storage as the last filter-coefficient for a next cycle; and coefficients output means, receiving the next filter-coefficient from the final adder means, for outputting the next filter-coefficient to the digital-audio filter, the next filter-coefficient replacing an existing filter coefficient in the digital-audio filter, the digital-audio filter producing a different phase shift when the next filter-coefficient replaces the existing filter coefficient, whereby the filter coefficients for producing a different phase shift are generated.

2. The filter-coefficient generator of claim 1 wherein the next filter-coefficient is generated without a division operation.

3. The filter-coefficient generator of claim 2 wherein the storage means is also for storing a maximum filter coefficient and a minimum filter coefficient;

direction-reversal means, receiving the last filter coefficient, for comparing the last filter coefficient to the maximum filter coefficient and to the minimum filter coefficient, the direction-reversal means generating a sweep reversal signal when the last filter coefficient matches either the maximum filter coefficient or the minimum filter coefficient;

wherein the sweep reversal signal indicates when the up-sweep changes to the down-sweep and when the down-sweep changes to an up-sweep;

wherein the final adder means is responsive to the sweep reversal signal from the direction-reversal means, the final adder means adding during an up-sweep, but subtracting during a down-sweep, whereby sweep direction is reversed.

4. The filter-coefficient generator of claim 3 wherein the filter coefficients are continuously re-generated while the digital-audio filter is creating the audio special effect.

5. The filter-coefficient generator of claim 4 wherein the sweep factor comprises a plurality of electrical signals that represent an exact binary power of two;

wherein the second multiplier means comprises a shifter for shifting the first output by a number of bit-positions determined by the sweep factor from the storage means, the shifter outputting the second output, whereby one multiply and one shift are used to generate each filter coefficient.

6. The filter-coefficient generator of claim 5 wherein the first multiplier means and the second multiplier means comprise a program means that controls a multiplier on a general-purpose processor;

wherein the first subtractor means and the final adder means comprise a program means that controls an adder in the general-purpose processor, wherein the filter-coefficient generator includes a program means executing on the general-purpose processor using the multiplier and the adder.

7. The filter-coefficient generator of claim 5 wherein the first multiplier means and the second multiplier means comprise a program means that controls a multiplier on a digital-signal processor;

wherein the first subtractor means and the final adder means comprise a program means that controls an adder in the digital-signal processor, wherein the filter-coefficient generator includes a program means executing on the digital-signal processor using the multiplier and the adder.

8. A personal computer (PC) for creating an audio special effect, the PC comprising:

a central processing unit (CPU) for executing user programs and an operating system;

a filter-coefficient generator program executing on the PC, the filter-coefficient generator program generating filter coefficients, the filter coefficients for producing a sweeping phase-shift audio special effect;

a digital-signal processor (DSP) receiving filter coefficients from the filter-coefficient generator program, the DSP receiving an input stream of digital-audio samples and outputting an output stream of digital audio samples, the output stream being the input stream with the sweeping phase-shift audio special effect, the DSP including program means to perform an all-pass filter on the input stream and to add an output of the all-pass filter to the input stream to generate the output stream;

the filter-coefficient generator program comprising program means for:

storing a last filter coefficient sent to the DSP;

multiplying the last filter coefficient by itself to produce a square of the last filter coefficient;

subtracting the square of the last filter coefficient from a constant and multiplying by a sweep factor to produce a sweep term;

adding or subtracting the sweep term from the last filter coefficient to produce a next filter-coefficient; and storing the next filter-coefficient as the last filter coefficient and sending the next filter-coefficient to the DSP, the next filter-coefficient causing the all-pass filter to produce a different phase shift in the output stream;

audio speakers, receiving the output stream, for generating audible audio containing the audio special effect, whereby the filter coefficients are generated without division.

9. The PC of claim 8 wherein the filter-coefficient generator program further comprises program means for:

changing a sweep direction downward by subtracting the sweep term for next filter-coefficients, the sweep direction changing downward when the sweep term was added, and the next filter-coefficient exceeds a maximum filter coefficient;

changing the sweep direction upward by adding the sweep term for next filter-coefficients, the sweep direction changing upward when the sweep term was subtracted, and the next filter-coefficient is less than a minimum filter coefficient, whereby sweep direction changes when the maximum or minimum filter coefficient is reached.

10. The PC of claim 9 wherein the sweep direction changes about every half-second, whereby the audio special effect has a repeated cycle of about one second.

11. The PC of claim 9 wherein the all-pass filter in the DSP comprises:

last input storage for storing a last input sample to the all-pass filter;

last output storage for storing a last output from the all-pass filter;

first adder means for adding an input sample to the last output from the last output storage to produce a first sum;

multiplier means, receiving a filter coefficient generated by the filter-coefficient generator program, for multiplying the filter coefficient with the first sum from the first adder means, the multiplier means outputting a first product;

subtractor means, receiving the first product, for subtracting the last input sample from the last input storage from the first product, the subtractor means outputting a filtered sample having a phase shift, the filtered sample sent to the last output storage for storage as the last output sample for a next sample processed by the all-pass filter, whereby the all-pass filter shifts a phase of the filtered sample by multiplying the filter coefficient.

12. The PC of claim 11 wherein the DSP executes four all-pass filters in series on the input stream to produce the output stream.

13. The PC of claim 11 wherein the CPU executes the filter-coefficient generator program and sends the filter coefficients to the DSP.

14. The PC of claim 11 wherein the DSP executes the filter-coefficient generator program and sends the filter coefficients to the all-pass filter in the DSP.

15. A computer-implemented method for generating filter coefficients for producing an audio special effect in a filter, the computer-implemented method comprising:

storing a last filter coefficient sent to the filter;

multiplying the last filter coefficient by itself to produce a square of the last filter coefficient;

subtracting the square of the last filter coefficient from a constant and multiplying by a sweep factor to produce a sweep term;

adding or subtracting the sweep term from the last filter coefficient to produce a next filter-coefficient; and storing the next filter-coefficient as the last filter coefficient and sending the next filter-coefficient to the filter, the next filter-coefficient causing the filter to produce a different phase shift in an output stream;

converting the output stream from digital values to analog voltages for driving a sound transducer for generating sound waves for the audio special effect, wherein the different phase shift is the audio special effect, whereby the filter coefficients are generated without division.

16. The computer-implemented method of claim 15 further comprising:

continuously generating next filter-coefficients while the audio special effect is being generated, whereby the filter coefficients are continuously re-generated during the audio special effect.

17. The computer-implemented method of claim 16 further comprising:

changing downward a sweep direction by subtracting the sweep term for next filter-coefficients, the sweep direction changing downward when the sweep term was added, and the next filter-coefficient exceeds a maximum filter coefficient;

changing upward the sweep direction by adding the sweep term for next filter-coefficients, the sweep direction changing upward when the sweep term was subtracted, and the next filter-coefficient is less than a minimum filter coefficient;

whereby sweep direction changes when the maximum or minimum filter coefficient is reached.

18. The computer-implemented method of claim 17 wherein the sweep direction is changed about every half-second, whereby the audio special effect has a repeated cycle of about one second.

19. The computer-implemented method of claim 17 wherein the computer-implemented method is further for filtering an input stream to produce an output stream with the audio special effect, the filter including an all-pass filter comprising the steps of:

storing a last input sample to the all-pass filter;

storing a last output from the all-pass filter;

adding the input sample to the last output to produce a first sum;

receiving the filter coefficient and multiplying the filter coefficient with the first sum and outputting a first product;

subtracting the last input sample from the first product, and outputting a filtered sample having a phase shift, the filtered sample stored as the last output sample for a next sample processed by the all-pass filter, whereby the all-pass filter shifts a phase of the filtered sample by multiplying the filter coefficient.

20. The computer-implemented method of claim 19 wherein the filter executes four all-pass filters in series on the input stream to produce the output stream.

* * * * *

UNITED STATES PATENT AND TRADEMARK OFFICE
CERTIFICATE OF CORRECTION

| | |
|---|---|
| PATENT NO. | : 5,903,480 |
| APPLICATION NO. | : 08/939603 |
| DATED | : May 11, 1999 |
| INVENTOR(S) | : Lin |

It is certified that error appears in the above-identified patent and that said Letters Patent is hereby corrected as shown below:

Title page, item [73], "NeoMagic," should read --NeoMagic Corp.",--.

Signed and Sealed this

Twenty-ninth Day of January, 2008

JON W. DUDAS
*Director of the United States Patent and Trademark Office*